(12) United States Patent
Nakamura et al.

(10) Patent No.: US 10,398,023 B2
(45) Date of Patent: Aug. 27, 2019

(54) SEMICONDUCTOR DEVICE

(71) Applicant: FUJI ELECTRIC CO., LTD., Kawasaki-shi, Kanagawa (JP)

(72) Inventors: Hideyo Nakamura, Kawasaki (JP); Masafumi Horio, Kawasaki (JP)

(73) Assignee: FUJI ELECTRIC CO., LTD., Kawasaki-sShi, Kanagawa (JP)

( * ) Notice: Subject to any disclaimer, the term of this patent is extended or adjusted under 35 U.S.C. 154(b) by 0 days.

(21) Appl. No.: 16/249,391

(22) Filed: Jan. 16, 2019

(65) Prior Publication Data

US 2019/0150268 A1 May 16, 2019

Related U.S. Application Data

(60) Division of application No. 15/091,564, filed on Apr. 5, 2016, now Pat. No. 10,187,973, which is a
(Continued)

(30) Foreign Application Priority Data

Apr. 14, 2014 (JP) .................................. 2014-082651

(51) Int. Cl.
*H05K 1/02* (2006.01)
*H01L 25/065* (2006.01)
(Continued)

(52) U.S. Cl.
CPC ......... *H05K 1/025* (2013.01); *H01L 25/0655* (2013.01); *H01L 25/072* (2013.01);
(Continued)

(58) Field of Classification Search
CPC ...... H05K 1/025; H05K 1/0306; H05K 1/181; H01L 25/072; H01L 25/162; H01L 25/0655; H02M 7/487; H02M 7/003
See application file for complete search history.

(56) References Cited

U.S. PATENT DOCUMENTS 9,590,622 B1 3/2017 Inaba et al.
10,163,868 B2 * 12/2018 Horio .................. H01L 23/3735
(Continued)

FOREIGN PATENT DOCUMENTS

CN 102315209 A 1/2012
JP 2000-295864 A 10/2000
(Continued)

*Primary Examiner* — Nathan Milakovich
(74) *Attorney, Agent, or Firm* — Rabin & Berdo, P.C.

(57) ABSTRACT

A semiconductor device includes a first circuit board on which a first switching element and a first diode connected in inverse parallel are mounted, a second circuit board on which a second switching element and a second diode connected in inverse parallel are mounted, a printed circuit board disposed opposite the first circuit board and the second circuit board, and a plurality of conductive posts which electrically connect the first switching element, the second switching element, the first diode, the second diode, the first circuit board, or the second circuit board and metal layers of the printed circuit board. The first switching element and the second switching element are connected in anti-series to form a bidirectional switch.

7 Claims, 11 Drawing Sheets

Related U.S. Application Data continuation of application No. PCT/JP2015/060743, filed on Apr. 6, 2015.

(51) Int. Cl.

| | | |
|---|---|---|
| *H05K 1/18* | (2006.01) | |
| *H01L 25/07* | (2006.01) | |
| *H01L 25/16* | (2006.01) | |
| *H02M 7/00* | (2006.01) | |
| *H02M 7/487* | (2007.01) | |
| *H05K 1/03* | (2006.01) | |

(52) U.S. Cl.
CPC ......... *H01L 25/162* (2013.01); *H05K 1/0306* (2013.01); *H05K 1/181* (2013.01); *H01L 2224/48091* (2013.01); *H01L 2224/48137* (2013.01); *H01L 2224/48139* (2013.01); *H01L 2224/73265* (2013.01); *H01L 2924/13055* (2013.01); *H01L 2924/13091* (2013.01); *H02M 7/003* (2013.01); *H02M 7/487* (2013.01); *H05K 2201/1053* (2013.01); *H05K 2201/10166* (2013.01); *H05K 2201/10174* (2013.01)

(56) References Cited

U.S. PATENT DOCUMENTS

| | | |
|---|---|---|
| 2010/0039843 A1 | 2/2010 | Takizawa |
| 2012/0001227 A1 | 1/2012 | Takahashi et al. |
| 2013/0277800 A1 | 10/2013 | Hori et al. |
| 2014/0346659 A1 | 11/2014 | Nakamura et al. |
| 2014/0346676 A1 | 11/2014 | Horio et al. |
| 2014/0361424 A1 | 12/2014 | Horio et al. |
| 2014/0367736 A1 | 12/2014 | Iizuka et al. |
| 2015/0223339 A1 | 8/2015 | Nakamura et al. |
| 2016/0192495 A1 | 6/2016 | Nakamura et al. |

FOREIGN PATENT DOCUMENTS

| | | |
|---|---|---|
| JP | 2008-193779 A | 8/2008 |
| JP | 2009-064852 A | 3/2009 |
| JP | 2012-119618 A | 6/2012 |
| JP | 2013-215042 A | 10/2013 |
| JP | 2013-222950 A | 10/2013 |
| WO | WO-2013/118415 A1 | 8/2013 |
| WO | WO-2013/145619 A1 | 10/2013 |
| WO | WO-2013/145620 A1 | 10/2013 |
| WO | WO-2013/146212 A1 | 10/2013 |
| WO | WO-2014/061211 A1 | 4/2014 |

\* cited by examiner

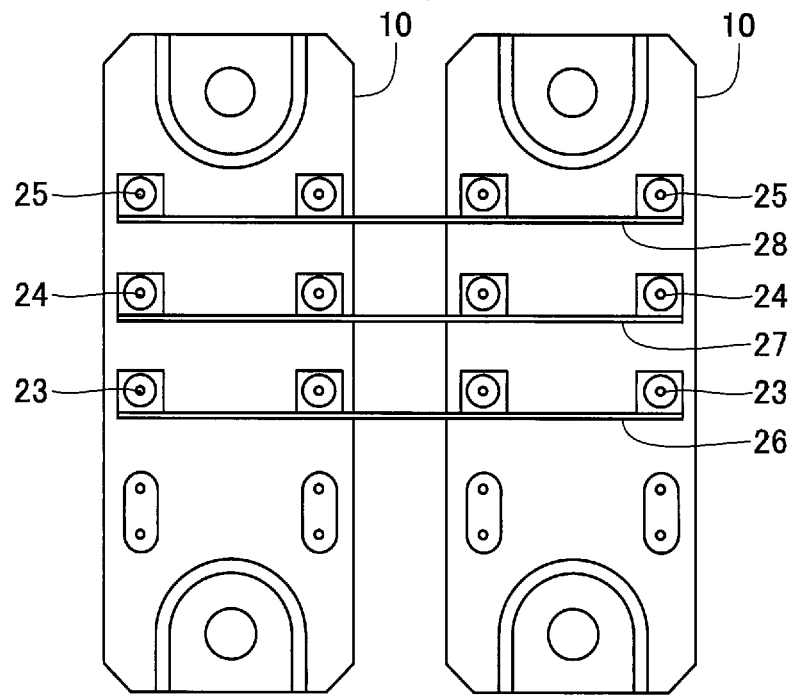
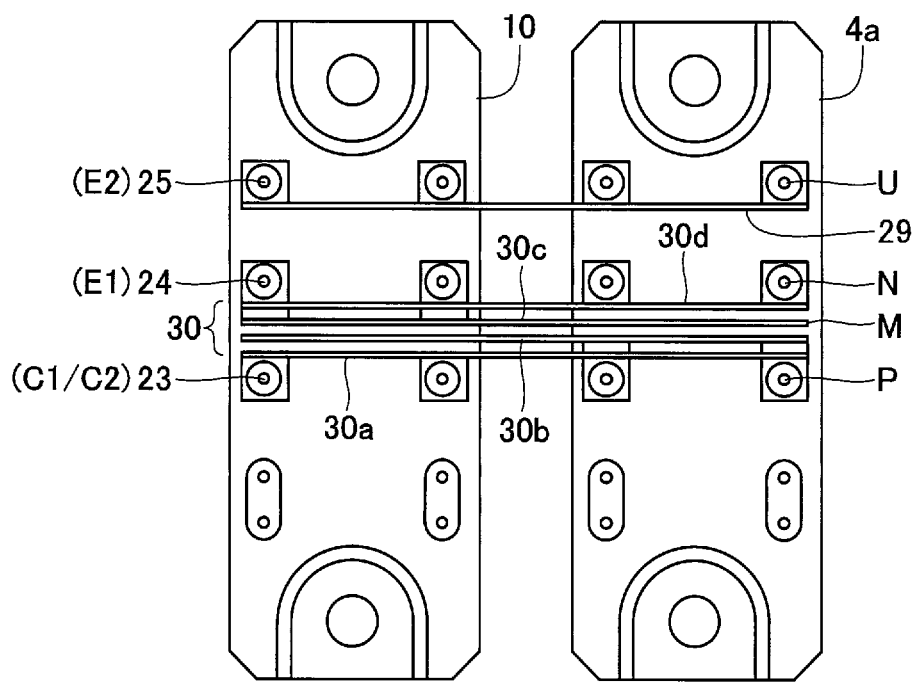

SEMICONDUCTOR DEVICE

CROSS-REFERENCE TO RELATED APPLICATION

This is a divisional application of U.S. application Ser. No. 15/091,564, filed on Apr. 5, 2016, and allowed on Sep. 19, 2018, which is a continuation application of International Application PCT/JP2015/060743 filed on Apr. 6, 2015, which claims priority from Japanese Patent Application No. 2014-082651, filed on Apr. 14, 2014, the contents of which are incorporated herein by reference.

BACKGROUND OF THE INVENTION

1. Field of the Invention

The embodiments discussed herein relate to a semiconductor device.

2. Background of the Related Art

Highly efficient and low-noise power converters are developed for power conditioners for photovoltaic power generation, motor controllers for electric vehicles, and the like. The power converters include inverter units formed by combining semiconductor devices each including semiconductor chips.

Insulated gate bipolar transistors (IGBT), power metal-oxide-semiconductor field-effect transistors (MOSFET), and free wheeling diodes (FWD) are used as semiconductor chips included in semiconductor devices.

FIG. 11 is a sectional view which illustrates an example of the structure of a conventional semiconductor device.

A semiconductor device 100 illustrated in FIG. 11 includes two semiconductor chips 101 and 102. The semiconductor device 100 includes an insulating substrate 103. The insulating substrate 103 includes a ceramic board 103a, a circuit board 103b stuck on a front (upper surface in FIG. 11) of the ceramic board 103a, and a metal board 103c stuck on a back (under surface in FIG. 11) of the ceramic board 103a.

The semiconductor chips 101 and 102 are joined to the circuit board 103b by the use of solder 104 and a plurality of external terminals 105 are joined to the circuit board 103b by the use of the solder 104.

Furthermore, a heat radiation base plate 107 is joined to the back of the metal board 103c by the use of solder 108.

The semiconductor chips 101 and 102 are electrically connected by a bonding wire 109 and the semiconductor chip 102 and the circuit board 103b are electrically connected by the bonding wire 109.

Furthermore, the base plate 107, the insulating substrate 103, and the semiconductor chips 101 and 102 are housed in a box-shaped resin case 110 having an open bottom. Furthermore, resin is injected into the resin case 110 and is cured. By doing so, the internal components are sealed.

An inverter unit is formed by combining a plurality of semiconductor devices each of which is similar to the above semiconductor device. It is suggested that at this time the plurality of semiconductor devices are connected by connecting their external terminals by the use of plate-shaped bus bars (see, for example, International Publication Pamphlet No. WO2013/146212).

By the way, with the conventional semiconductor device 100 wiring is performed by the use of thin bonding wires. This makes it difficult to reduce the wiring inductance in the semiconductor device 100. As a result, it is impossible to accommodate high-speed switching.

In addition, with the conventional technique described in, for example, International Publication Pamphlet No. WO2013/146212, plate-shaped bus bars are used for connecting a plurality of semiconductor devices. This reduces the wiring inductance among the semiconductor devices. However, there are various demands for the shapes of packages of actual semiconductor devices. As a result, wiring routing performed by the use of bus bars often becomes complex. Furthermore, usually a bus bar becomes thinner with a reduction in the size of semiconductor devices. In many cases, this leads to an increase in inductance.

SUMMARY OF THE INVENTION

According to one aspect, there is provided a semiconductor device including: a first switching element and a second switching element; a first diode and a second diode; a first circuit board on which the first switching element and the first diode are mounted; a second circuit board on which the second switching element and the second diode are mounted; a printed circuit board disposed opposite the first circuit board and the second circuit board and including metal layers; and a plurality of conductive posts which electrically connect the first switching element, the second switching element, the first diode, the second diode, the first circuit board, or the second circuit board and the metal layers of the printed circuit board, wherein a bidirectional switch is formed by connecting the first switching element and the first diode in inverse parallel; connecting the second switching element and the second diode in inverse parallel; and connecting the first switching element and the second switching element in anti-series via the plurality of conductive posts and, the metal layers, and the first circuit board or the second circuit board.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 6A and 6B illustrate the forms of the use of the semiconductor device according to the first embodiment;

DETAILED DESCRIPTION OF THE INVENTION

Embodiments will now be described in detail with reference to the drawings. A plurality of embodiments may be combined, if possible.

First Embodiment

Figure 1:
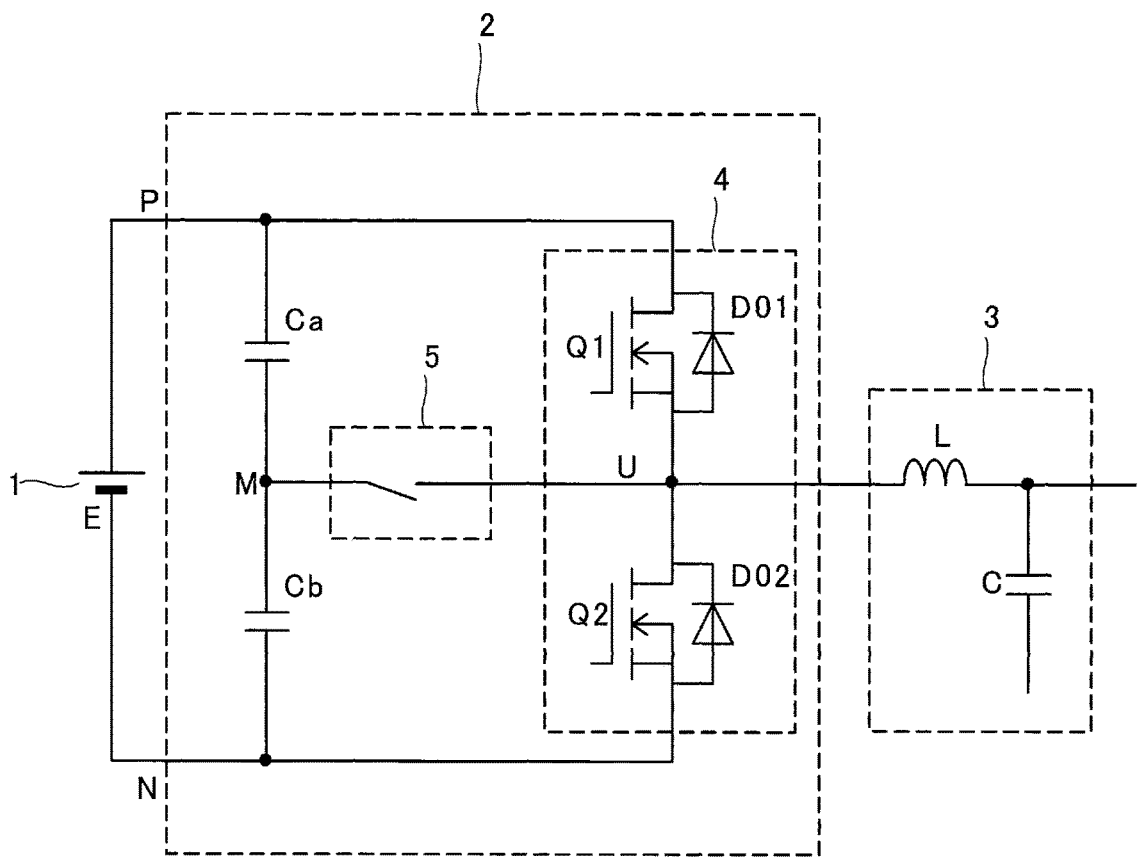
FIG. 1 illustrates the basic structure of a three-level inverter unit to which a semiconductor device according to a first embodiment is applied.
Figure 2:
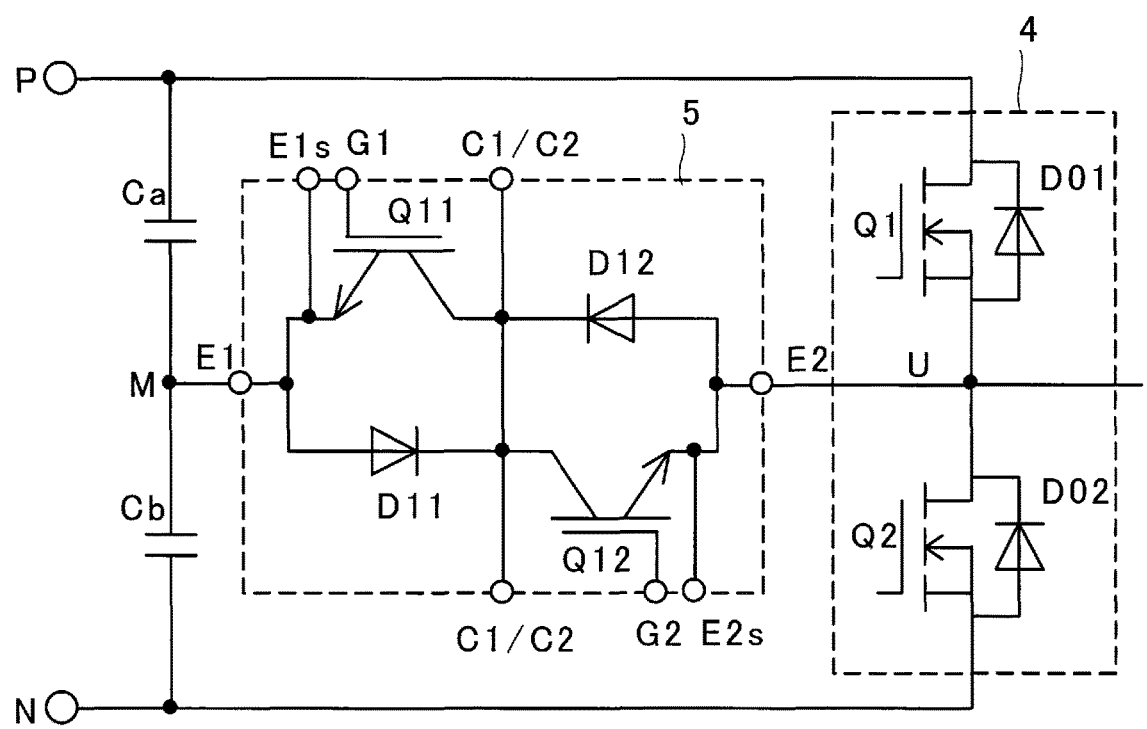
FIG. 2 is a circuit diagram which illustrates an example of the structure of a three-level inverter.

FIG. 1 illustrates the basic structure of a three-level inverter unit to which a semiconductor device according to a first embodiment is applied. FIG. 2 is a circuit diagram which illustrates an example of the structure of a three-level inverter.

As illustrated in FIG. 1, a three-level inverter unit to which a semiconductor device according to a first embodiment is applied includes a direct-current power supply 1, a conversion section 2, and a filter section 3.

The conversion section 2 includes a capacitor Ca, a capacitor Cb, an inverter 4, and an intermediate arm block 5. One terminal of the capacitor Ca is connected to the positive electrode terminal P of the direct-current power supply 1 and the other terminal of the capacitor Ca is connected to a terminal of the capacitor Cb. Furthermore, the other terminal of the capacitor Cb is connected to the negative electrode terminal N of the direct-current power supply 1. The inverter 4 is connected in parallel with a circuit including the capacitor Ca and the capacitor Cb connected in series. The inverter 4 includes transistors Q1 and Q2 and diodes D01 and D02. The transistor Q1 and the diode D01 are connected in inverse parallel and make up the upper arm of the inverter 4. In addition, the transistor Q2 and the diode D02 are connected in inverse parallel and make up the lower arm of the inverter 4. In the present specification, the term "inverse parallel" is given its ordinary meaning and refers to elements configured to allow current flow in opposite directions. For example, where the diode D01 is configured to allow current flow from a first end to a second end, and the transistor Q1 is configured to allow current flow from a first end, such as a collector, to a second end, such as an emitter, the first end of the diode D01 is connected to the second end of the transistor Q01, and the second end of the diode D01 is connected to the first end of the transistor Q1. Furthermore, the upper arm and the lower arm are connected in series to form the inverter 4. In the example of FIG. 1, n-channel MOSFETs are used as the transistors Q1 and Q2. An intermediate arm block 5 is disposed between an intermediate potential point M between the capacitors Ca and Cb and an intermediate connection point U between the transistors Q1 and Q2. The intermediate arm block 5 is a bidirectional switch formed of semiconductor elements.

The filter section 3 connected to the conversion section 2 includes a coil L and a capacitor C. One end of the coil L is connected to the intermediate connection point U between the transistors Q1 and Q2 and the other end of the coil L is connected to one terminal of the capacitor C.

This three-level inverter unit always clamps voltage applied to the transistors Q1 and Q2 of the inverter 4 at half of voltage E of the direct-current power supply 1. As a result, an output waveform of the inverter 4 is a pulse width modulation (PWM) pulse obtained by combining ±E/2 and ±E with a zero point as a center. Therefore, a waveform generated by the three-level inverter unit is close to a sine wave compared with an output waveform of an ordinary two-level inverter unit. Furthermore, the filter section 3 used for making an output waveform a sine wave becomes smaller in size. In addition, the width of fluctuations in voltage at the time of the switching operation of the transistors Q1 and Q2 is half of that of a two-level inverter unit. As a result, switching loss or switching noise of the transistors Q1 and Q2 is reduced and efficiency in switching operation is improved.

A semiconductor device according to a first embodiment is applied to the intermediate arm block 5 of the above three-level inverter unit. As illustrated in FIG. 2, the intermediate arm block 5 according to a first embodiment includes transistors Q11 and Q12, which are IGBTs, and diodes D11 and D12.

The emitter, collector, auxiliary emitter, and gate of the transistor Q11 are connected to a terminal E1, a terminal C1/C2, a terminal E1s, and a terminal G1 respectively. The anode and cathode of the diode D11 are connected to the terminal E1 and the terminal C1/C2 respectively. That is to say, the transistor Q11 and the diode D11 are connected in inverse parallel.

The emitter, collector, auxiliary emitter, and gate of the transistor Q12 are connected to a terminal E2, a terminal C1/C2, a terminal E2s, and a terminal G2 respectively. The anode and cathode of the diode D12 are connected to the terminal E2 and the terminal C1/C2 respectively. That is to say, the transistor Q12 and the diode D12 are connected in inverse parallel.

The terminals C1/C2 are electrically connected inside the intermediate arm block 5. That is to say, all of the collector of the transistor Q11, the collector of the transistor Q12, the cathode of the diode D11, and the cathode of the diode D12 are connected to the terminals C1/C2. The transistors Q11 and Q12 are connected in this way in anti-series. In the present specification and claims, the term "anti-series" is given its ordinary meaning, which is two elements connected in series arranged in such a way as to permit current flow in opposite directions through a circuit. For example, as illustrated in FIG. 2, the collector of the transistor Q11 is connected to the collector of the transistor Q12 at terminal C1/C2.

The terminal E1 of the intermediate arm block 5 is connected to the intermediate potential point M which is a connection point common to the capacitors Ca and Cb, and the terminal E2 of the intermediate arm block 5 is connected to the intermediate connection point U which is a connection point common to the transistors Q1 and Q2. The terminals C1/C2 are not connected to an external circuit and are used for checking internal wiring, the characteristics of elements, and the like at production time.

The transistor Q11 is switched from an off (non-conducting) state to an on (conducting) state by applying determined voltage between the terminal G1 and the terminal E1s. The transistor Q12 is also switched from an off state to an on state by applying determined voltage between the terminal G2 and the terminal E2s.

When both of the transistors Q11 and Q12 are in an off state, an off state arises between the terminal E1 and the terminal E2.

Furthermore, when the transistor Q11 is in an on state and the transistor Q12 is in an off state, a circuit including the diode D12 and the transistor Q11 connected in series is in an on state. Therefore, the intermediate arm block 5 passes current in the direction of the terminal E2 to the terminal E1.

In addition, when the transistor Q11 is in an off state and the transistor Q12 is in an on state, a circuit including the diode D11 and the transistor Q12 connected in series is in an on state. Therefore, the intermediate arm block 5 passes current in the direction of the terminal E1 to the terminal E2.

As has been described, the intermediate arm block 5 has the above structure. As a result, the intermediate arm block 5 passes current in both directions by putting one of the transistors Q11 and Q12 into an on state and putting the other into an off state. That is to say, the intermediate arm block 5 has the function of a bidirectional switch.

Next, the concrete structure of a semiconductor device for realizing the intermediate arm block 5 having the above circuit structure will be described by the use of FIGS. 3 through 6.

Figure 3:
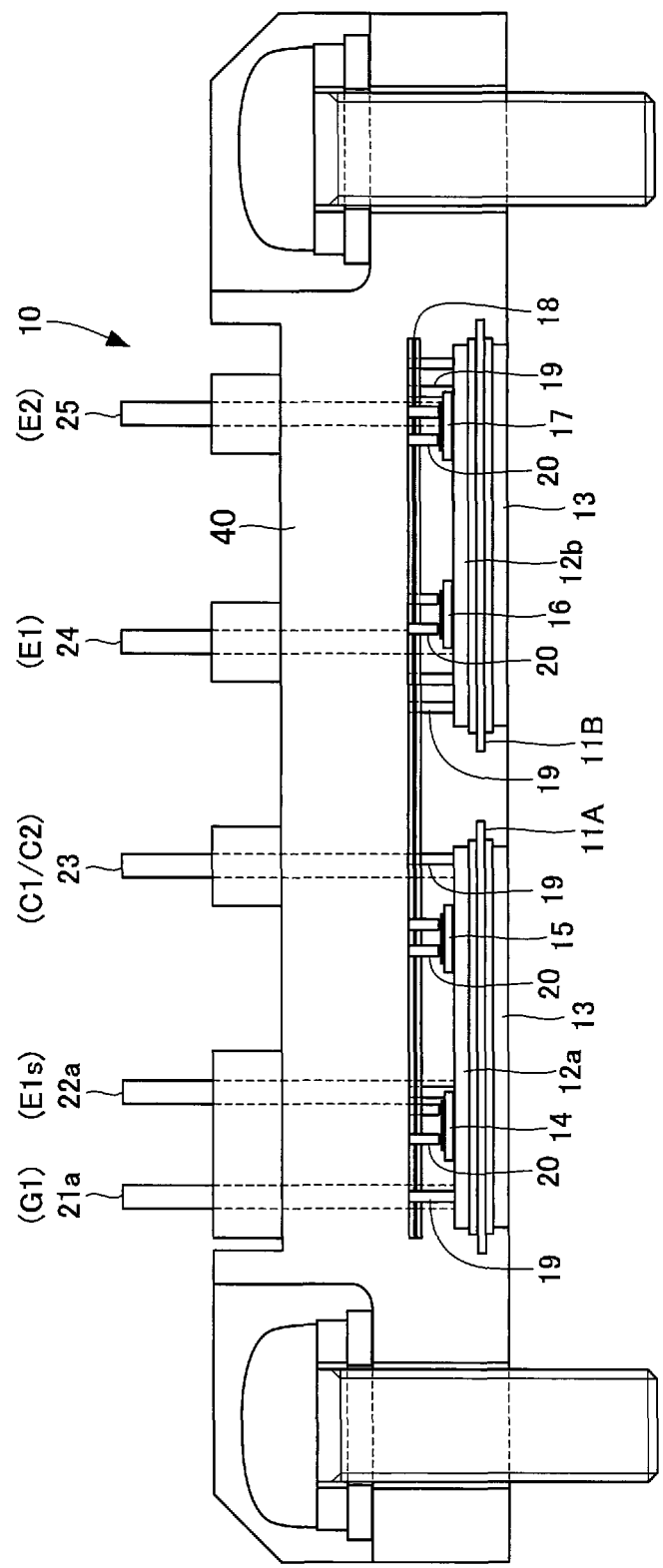
FIG. 3 is a central vertical sectional view of the semiconductor device according to the first embodiment.
Figure 4A:
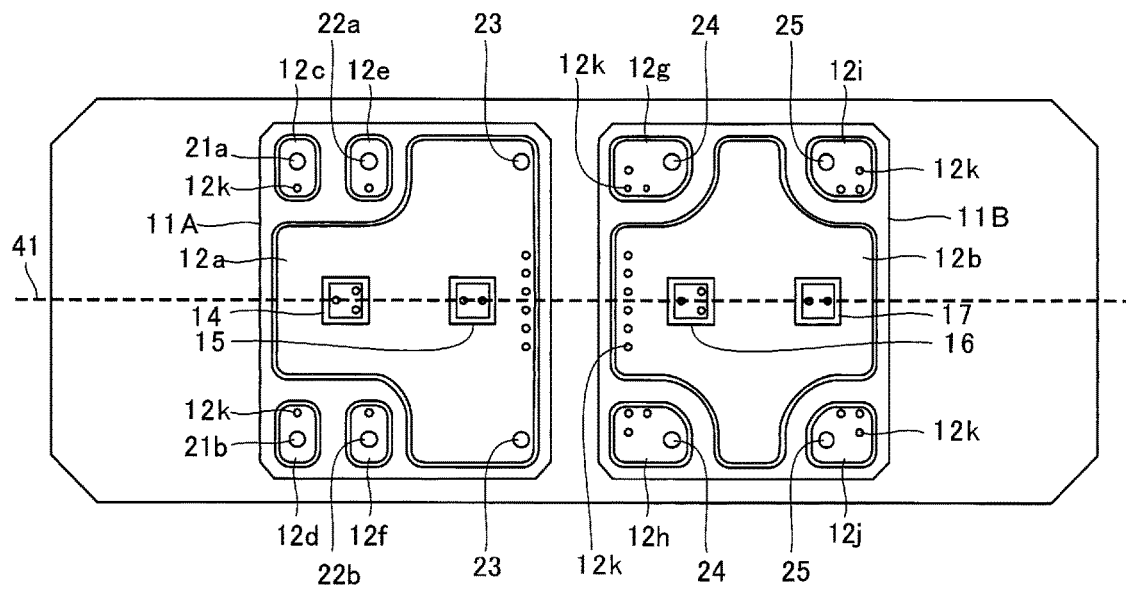
FIGS. 4A to 4C illustrate examples of a wiring pattern of the semiconductor device.
Figure 4B:
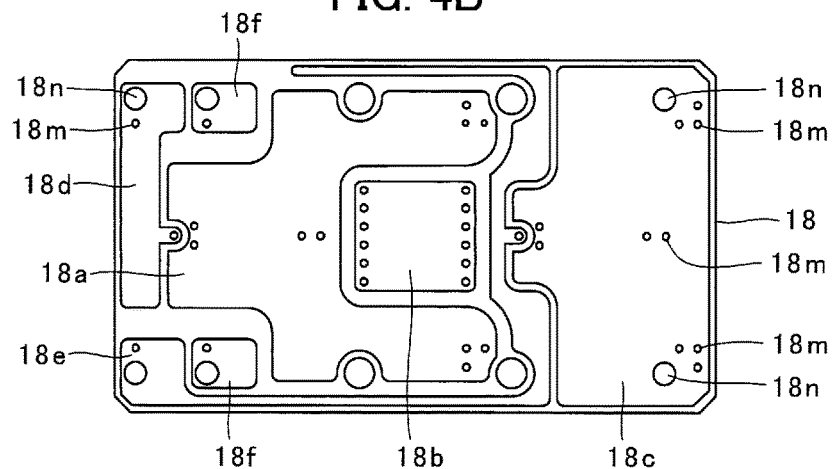
Figure 4C:
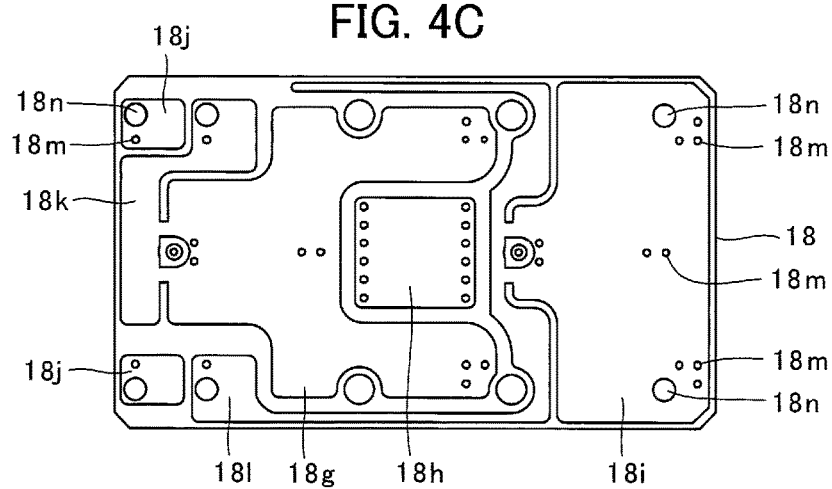
Figure 5:
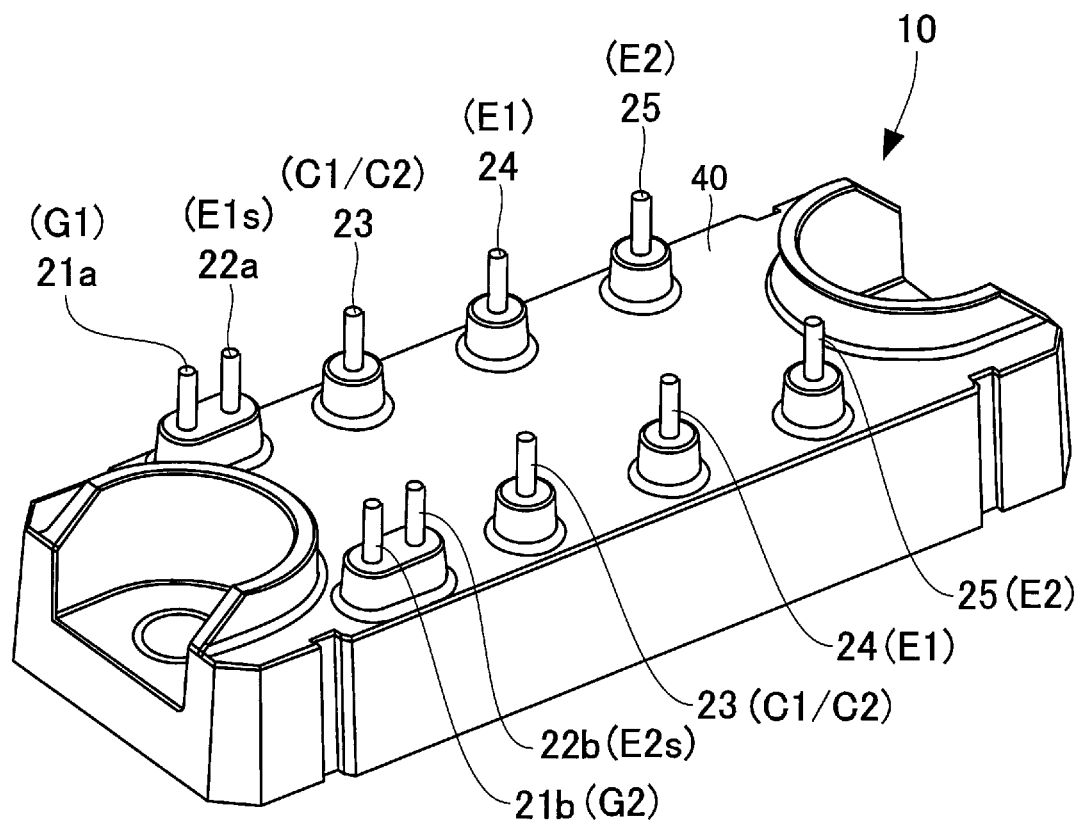
FIG. 5 is a perspective view which illustrates the appearance of the semiconductor device.

FIG. 3 is a central vertical sectional view of the semiconductor device according to the first embodiment. FIGS. 4A to 4C illustrate examples of a wiring pattern of the semiconductor device. FIG. 4A illustrates a wiring pattern of a circuit board. FIG. 4B illustrates a wiring pattern on an upper surface of a printed circuit board. FIG. 4C illustrates a wiring pattern on an under surface of the printed circuit board. For ease of understanding, FIG. 4C illustrates a wiring pattern seen by turning over the printed circuit board (that is to say, wiring pattern seen through the upper surface). FIG. 5 is a perspective view which illustrates the appearance of the semiconductor device. FIGS. 6A and 6B illustrate the forms of the use of the semiconductor device according to the first embodiment.

A semiconductor device 10 includes a first switching element 14, a second switching element 16, a first diode 15, a second diode 17, a first circuit board 12a, a second circuit board 12b, a printed circuit board 18, and conductive posts 19 and 20. The semiconductor device 10 further includes third circuit boards 12c, 12d, 12e, 12f, 12g, 12h, 12i, and 12j and external terminals 21a, 21b, 22a, 22b, 23, 24, and 25. In the following, all of the above third circuit boards may collectively be referred to as the third circuit boards 12c through 12j.

As illustrated in FIGS. 3 and 4A, the semiconductor device 10 includes a first insulating substrate 11A and a second insulating substrate 11B disposed side by side in a horizontal direction. Each of the first insulating substrate 11A and the second insulating substrate 11B includes a ceramic board made of alumina, aluminum nitride, silicon nitride, or the like having good heat transferability, a circuit board disposed on its upper surface, and a metal board disposed on its under surface.

In addition, the first circuit board 12a is disposed on the upper surface of the first insulating substrate 11A and a metal board 13 having the same thickness is disposed on the under surface of the first insulating substrate 11A. Furthermore, the second circuit board 12b is disposed on the upper surface of the second insulating substrate 11B and a metal board 13 having the same thickness is disposed on the under surface of the second insulating substrate 11B. Moreover, the third circuit boards 12c through 12j are disposed on the upper surfaces of the first insulating substrate 11A and the second insulating substrate 11B. The first circuit board 12a, the second circuit board 12b, and the third circuit boards 12c through 12j are made of, for example, a copper plate greater than or equal to 0.5 mm thick and smaller than or equal to 1.5 mm thick.

The first switching element 14 and the first diode 15 are mounted on the first circuit board 12a. Furthermore, the second switching element 16 and the second diode 17 are mounted on the second circuit board 12b. The first switching element 14 and the first diode 15 correspond to the transistor Q11 and the diode D11, respectively, illustrated in FIG. 2. In addition, the second switching element 16 and the second diode 17 correspond to the transistor Q12 and the diode D12, respectively, illustrated in FIG. 2. Moreover, the first switching element 14, the first diode 15, the second switching element 16, and the second diode 17 are mounted separately over the two insulating substrates. If the two insulating substrates are integrally formed, thermal stress causes the insulating substrate to deform significantly. As a result, the insulating substrate or resin may crack or a circuit board or resin may peel off the insulating substrate. In this embodiment, on the other hand, the two insulating substrates are used. This improves reliability.

The printed circuit board 18 is disposed over and opposite the first circuit board 12a and the second circuit board 12b at a determined distance from them. A metal layer having a wiring pattern illustrated in FIG. 4B is formed on the upper surface of the printed circuit board 18 and a metal layer having a wiring pattern illustrated in FIG. 4C is formed on the under surface of the printed circuit board 18.

A determined metal layer of the printed circuit board 18 and the first circuit board 12a, the second circuit board 12b, or the third circuit boards 12c through 12j are electrically connected via a cylindrical conductive post 19. Furthermore, a determined metal layer of the printed circuit board 18 and the first switching element 14, the first diode 15, the second switching element 16, or the second diode 17 are electrically connected via a cylindrical conductive post 20. In addition, the external terminals 21a, 21b, 22a, 22b, 23, 24, and 25 are connected electrically and mechanically to the first circuit board 12a and the third circuit boards 12c through 12j. These components are connected by the use of a conductive joining material such as solder or a sintered metal material.

The first circuit board 12a, the second circuit board 12b, the first switching element 14, the first diode 15, the second switching element 16, the second diode 17, the conductive posts 19 and 20, and the printed circuit board 18 are covered with resin such as thermosetting epoxy resin. As a result, the semiconductor device 10 illustrated in FIG. 5 is formed. By using resin 40, the semiconductor device 10 has an almost cuboid shape. The positions of the external terminals 21a and 21b disposed are symmetrical with respect to a center line which extends in the longitudinal direction. Similarly, the positions of the external terminals 22a and 22b disposed are symmetrical with respect to the center line which extends in the longitudinal direction. The positions of the external terminals 23 disposed are symmetrical with respect to the center line which extends in the longitudinal direction. The positions of the external terminals 24 disposed are symmetrical with respect to the center line which extends in the longitudinal direction. The positions of the external terminals 25 disposed are symmetrical with respect to the center line which extends in the longitudinal direction.

Electrical connection of the semiconductor device 10 described above will now be described with reference to FIG. 2.

As illustrated in FIG. 4A, the first insulating substrate 11A and the second insulating substrate 11B are disposed side by side in the longitudinal direction of the semiconductor device 10.

The first circuit board 12a and the third circuit boards 12c, 12d, 12e, and 12f are disposed on the upper surface of the first insulating substrate 11A. The first switching element 14 and the first diode 15 are mounted on the first circuit board 12a and the two external terminals 23 are connected to the first circuit board 12a. The external terminals 21a, 21b, 22a, and 22b are connected to the third circuit boards 12c, 12d, 12e, and 12f respectively.

The second circuit board 12b and the third circuit boards 12g, 12h, 12i, and 12j are disposed on the upper surface of the second insulating substrate 11B. The second switching element 16 and the second diode 17 are mounted on the second circuit board 12b. The two external terminals 24 are connected to the third circuit boards 12g and 12h respectively. The two external terminals 25 are connected to the third circuit boards 12i and 12j respectively.

The shape of each of the first circuit board 12a and the second circuit board 12b is symmetrical with respect to a center line 41 extending in a direction in which the first insulating substrate 11A and the second insulating substrate 11B are disposed side by side. In addition, the positions of the third circuit boards 12c and 12d disposed are symmetrical with respect to the center line 41. Similarly, the positions of the third circuit boards 12e and 12f disposed are symmetrical with respect to the center line 41. The positions of the third circuit boards 12g and 12h disposed are symmetrical with respect to the center line 41. The positions of the third circuit boards 12i and 12j disposed are symmetrical with respect to the center line 41. Furthermore, the switching element 14, the first diode 15, the second switching element 16, and the second diode 17 are disposed on the above center line 41.

Each of the first switching element 14 and the second switching element 16, which are IGBTs, has an emitter electrode and a gate electrode on its front and has a collector electrode on its back. Furthermore, the collector electrode of the first switching element 14 is connected electrically and mechanically to the first circuit board 12a and the collector electrode of the second switching element 16 is connected electrically and mechanically to the second circuit board 12b.

In addition, each of the first diode 15 and the second diode 17 has an anode electrode on its front and has a cathode electrode on its back. Moreover, the cathode electrode of the first diode 15 is connected electrically and mechanically to the second circuit board 12b.

The first circuit board 12a, the second circuit board 12b, and the third circuit boards 12c through 12j have a plurality of connection points 12k at which they are connected to the printed circuit board 18 via the conductive posts 19.

As illustrated in FIG. 4B, metal layers 18a, 18b, 18c, 18d, 18e, and 18f are disposed on the upper surface of the printed circuit board 18. The metal layers 18a, 18b, and 18c are metal layers for a main circuit. The metal layers 18d and 18e are metal layers for a gate circuit. The metal layer 18f is a metal layer for a terminal connection.

As illustrated in FIG. 4C, metal layers 18g, 18h, 18i, 18j, 18k, and 18l are disposed on the under surface of the printed circuit board 18. The metal layers 18g, 18h, and 18i are metal layers for the main circuit. The metal layer 18j is a metal layer for a terminal connection. The metal layers 18k and 18l are metal layers for an auxiliary emitter and are electrically connected to the metal layers 18g and 18i respectively.

A plurality of penetration holes 18m are made in the printed circuit board 18. The positions of the plurality of penetration holes 18m correspond to the positions of the plurality of connection points 12k, the electrodes of the first switching element 14, the electrode of the first diode 15, the electrodes of the second switching element 16, and the electrode of the second diode 17. In addition, penetration holes 18n whose positions correspond to positions at which the external terminals 21a, 21b, 22a, 22b, 23, 24, and 25 are connected are made in the printed circuit board 18.

The collector electrode of the first switching element 14 is connected via the first circuit board 12a to the external terminals 23 (terminals C1/C2). The emitter electrode of the first switching element 14 is connected via the conductive post 20 to the metal layers 18a and 18g of the printed circuit board 18 first and is then connected via the conductive post 19 and the third circuit board 12g (or the third circuit board 12h) to the external terminal 24 (terminal E1). The gate electrode of the first switching element 14 is connected via the conductive post 20 to the metal layer 18d first and is then connected via the conductive post 19 and the third circuit board 12c to the external terminal 21a (terminal G1). An auxiliary emitter electrode of the first switching element 14 is connected via the conductive post 20 to the metal layer 18g first and is then connected via the metal layer 18k, the conductive post 19, and the third circuit board 12e to the external terminal 22a (terminal E1s).

The cathode electrode of the first diode 15 is connected via the first circuit board 12a to the external terminals 23 (terminals C1/C2). The anode electrode of the first diode 15 is connected via the conductive post 20 to the metal layers 18a and 18g first and is then connected via the conductive post 19 and the third circuit board 12g (or the third circuit board 12h) to the external terminal 24 (terminal E1).

The collector electrode of the second switching element 16 is connected via the second circuit board 12b and the conductive post 19 to the metal layers 18b and 18h first and is then connected via the conductive post 19 and the first circuit board 12a to the external terminals 23 (terminals C1/C2). That is to say, the metal layers 18b and 18h function as a bridge which forms a current path of the collector between the first insulating substrate 11A and the second insulating substrate 11B separate from each other. The emitter electrode of the second switching element 16 is connected via the conductive post 20 to the metal layers 18c and 18i first and is then connected via the conductive post 19 and the third circuit board 12i (or the third circuit board 12j) to the external terminal 25 (terminal E2). The gate electrode of the second switching element 16 is connected via the conductive post 20 to the metal layer 18e first and is then connected via the conductive post 19 and the third circuit board 12d to the external terminal 21b (terminal G2). An auxiliary emitter electrode of the second switching element 16 is connected via the conductive post 20 to the metal layer 18i first and is then connected via the metal layer 18l, the conductive post 19, and the third circuit board 12f to the external terminal 22b (terminal E2s).

The cathode electrode of the second diode 17 is connected via the second circuit board 12b and the conductive post 19 to the metal layers 18b and 18h first and is then connected via the conductive post 19 and the first circuit board 12a to the external terminals 23 (terminals C1/C2). The anode electrode of the second diode 17 is connected via the conductive post 20 to the metal layers 18c and 18i first and is then connected via the conductive post 19 and the third circuit board 12*i* (or the third circuit board 12*j*) to the external terminal 25 (terminal E2).

Wiring inside the semiconductor device 10 having the above structure is formed of the printed circuit board 18 and the conductive posts 19 and 20. As a result, current paths are broad and short compared with the bonding wires used in the conventional semiconductor device 100. Therefore, the wiring inductance is significantly reduced. This means that a semiconductor device which accommodates high-speed switching is realized.

In addition, a plurality of semiconductor devices 10 can easily be connected in parallel in order to increase the current capacity of the intermediate arm block 5. FIG. 6A illustrates an example of the intermediate arm block 5 whose current capacity is increased by disposing two semiconductor devices 10 side by side and connecting them in parallel by the use of bus bars 26, 27, and 28. With the semiconductor device 10 according to the first embodiment the two external terminals 23 are disposed side by side in the lateral direction of the semiconductor device 10. Similarly, the two external terminals 24 are disposed side by side in the lateral direction of the semiconductor device 10 and the two external terminals 25 are disposed side by side in the lateral direction of the semiconductor device 10. As a result, even if a plurality of semiconductor devices 10 are connected in parallel, external terminals 23 are disposed straight. Similarly, external terminals 24 are disposed straight and external terminals 25 are disposed straight. Therefore, each of the bus bars 26, 27, and 28 provides the shortest straight wiring. This reduces not only the wiring inductance inside the semiconductor device but also the wiring inductance outside the semiconductor device 10. As a result, a large-current-capacity semiconductor device which accommodates high-speed switching is realized.

Furthermore, in the example of FIG. 6B, the inverter 4 and the intermediate arm block 5 illustrated in FIG. 2 are housed in packages of identical shape and a semiconductor device 4*a* of the inverter 4 and the semiconductor device 10 of the intermediate arm block 5 are combined. It is assumed that with the semiconductor device 4*a* of the inverter 4 external terminals are disposed in the order of gate terminals and auxiliary source terminals of the transistors Q1 and Q2, the positive electrode terminals P, the negative electrode terminals N, and the intermediate connection points U from the bottom of FIG. 6B.

The semiconductor device 4*a* of the inverter 4 and the semiconductor device 10 of the intermediate arm block 5 are disposed side by side in the lateral direction of them and are connected by a bus bar 29 and a laminated bus bar 30.

The bus bar 29 connects the external terminals (terminals E2) of the semiconductor device 10 and the intermediate connection points U of the semiconductor device 4*a* at the shortest distance. The laminated bus bar 30 is formed by laminating four metal conductor and insulating film sheets. The laminated bus bar 30 includes a bus bar 30*a* connected to the terminals C1/C2, a bus bar 30*b* connected to the positive electrode terminals P, a bus bar 30*c* connected to the intermediate potential points M, and a bus bar 30*d* connected to the negative electrode terminals N. The bus bar 30*a* is connected to the external terminals 23 of the semiconductor device 10. The bus bar 30*b* is connected to the positive electrode terminals P of the semiconductor device 4*a*. The bus bar 30*c* is connected to the external terminals 24 of the semiconductor device 10. The bus bar 30*d* is connected to the negative electrode terminals N of the semiconductor device 4*a*.

The semiconductor device 4*a* of the inverter 4 and the semiconductor device 10 of the intermediate arm block 5 are connected in this way at the shortest distance by the bus bar 29 and the laminated bus bar 30. This reduces not only the wiring inductance inside the semiconductor device 4*a* and the semiconductor device 10 but also the wiring inductance outside the semiconductor device 4*a* and the semiconductor device 10. Furthermore, because the laminated bus bar 30 includes many layers is applied, the mutual inductance of external wiring between the semiconductor device 4*a* and the semiconductor device 10 is also reduced. As a result, a three-level inverter unit which accommodates high-speed switching is provided.

In the first embodiment the example in which one first switching element 14, one first diode 15, one second switching element 16, and one second diode 17 are used is taken. However, plural first switching elements 14, plural first diodes 15, plural second switching elements 16, and plural second diodes 17 may be connected in parallel, depending on the magnitude of required current capacity.

Furthermore, the first switching element 14, the first diode 15, the second switching element 16, and the second diode 17 may be made of a silicon semiconductor or a wide-bandgap semiconductor such as silicon carbide (SiC), gallium nitride (GaN), or diamond.

Second Embodiment

Figure 7:
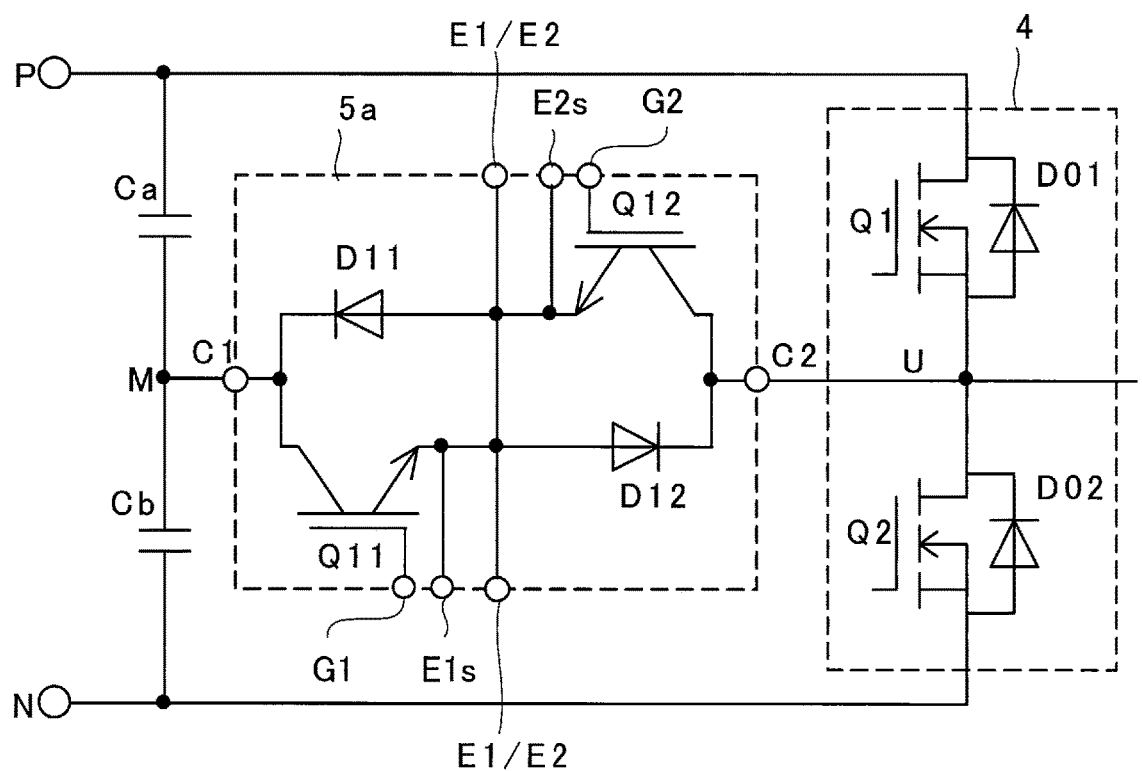
FIG. 7 is a circuit diagram which illustrates an example of the structure of a three-level inverter unit to which a semiconductor device according to a second embodiment is applied.
Figure 8A:
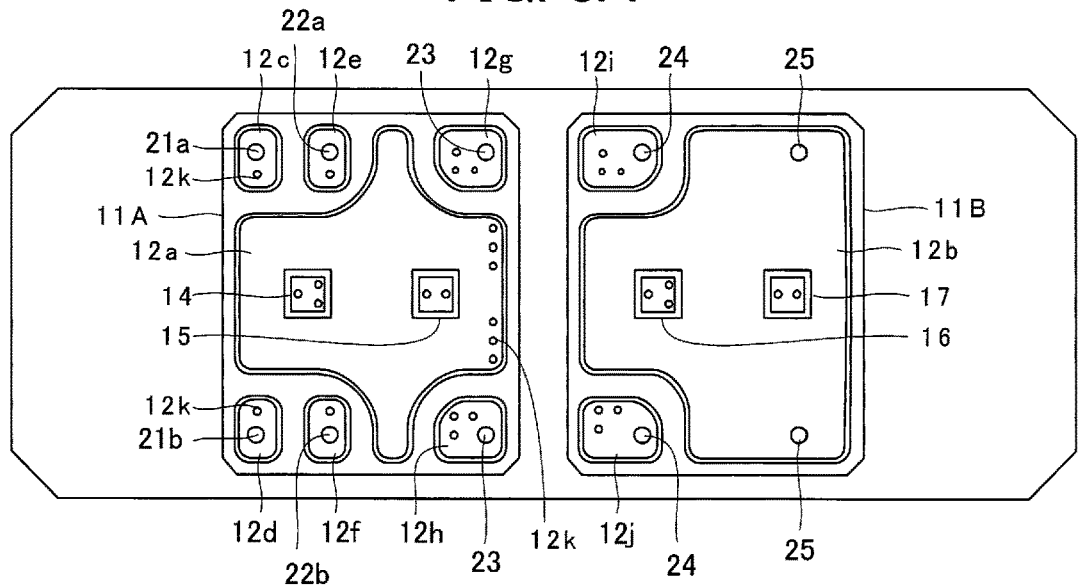
FIGS. 8A to 8C illustrate examples of a wiring pattern of the semiconductor device which forms the intermediate arm block illustrated in FIG. 7.
Figure 8B:
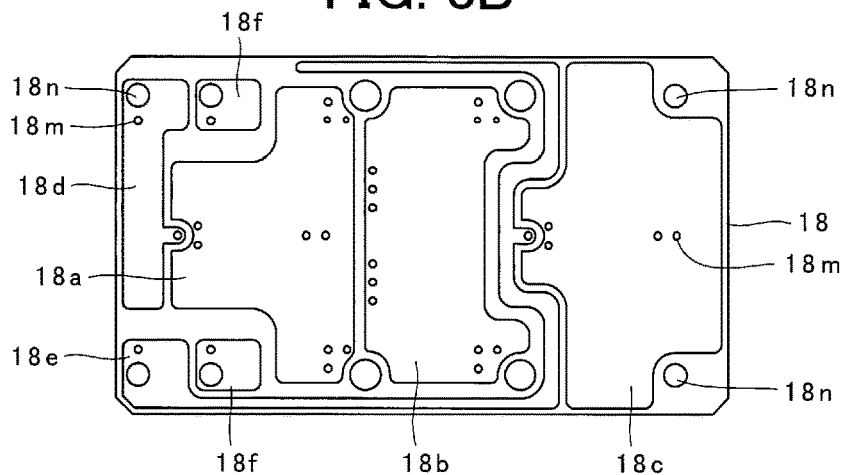
Figure 8C:
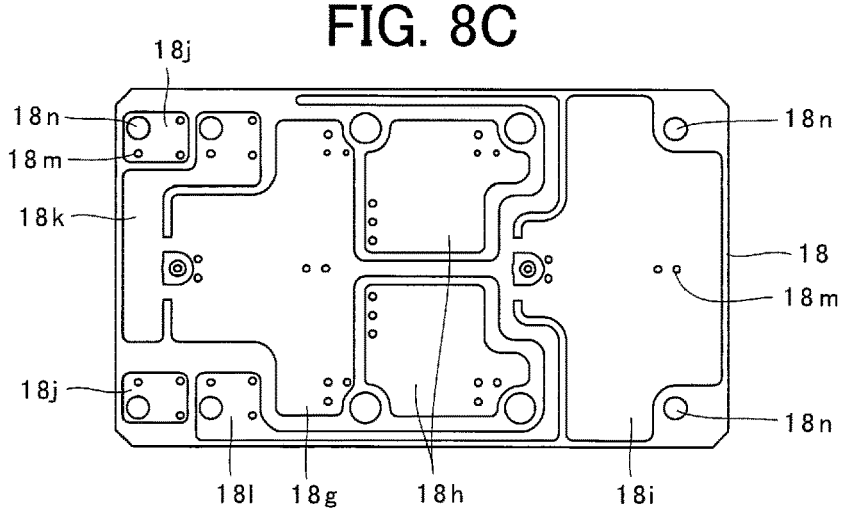

FIG. 7 is a circuit diagram which illustrates an example of the structure of a three-level inverter unit to which a semiconductor device according to a second embodiment is applied. FIGS. 8A to 8C illustrate examples of a wiring pattern of the semiconductor device which forms the intermediate arm block illustrated in FIG. 7. FIG. 8A illustrates a wiring pattern of a circuit board, FIG. 8B illustrates a wiring pattern on an upper surface of a printed circuit board, and FIG. 8C illustrates a wiring pattern on an under surface of the printed circuit board. For ease of understanding, FIG. 8C illustrates a wiring pattern seen by turning over the printed circuit board (that is to say, wiring pattern seen through the upper surface).

Components in the second embodiment which are the same as or equivalent to those illustrated in the first embodiment will be marked with the same numerals and detailed descriptions of them will be omitted.

Components used in an intermediate arm block 5*a* which is a semiconductor device according to a second embodiment are the same as those used in the intermediate arm block 5 which is the semiconductor device according to the first embodiment. However, the intermediate arm block 5*a* differs from the intermediate arm block 5 in circuit structure. That is to say, the collectors of the transistors Q11 and Q12 are connected in the intermediate arm block 5 which is the semiconductor device according to the first embodiment. On the other hand, emitters of transistors Q11 and Q12 are connected in the intermediate arm block 5*a* which is a semiconductor device according to a second embodiment. Details will now be described.

The emitter, collector, auxiliary emitter, and gate of the transistor Q11 are connected to a terminal E1/E2, a terminal C1, a terminal E1*s*, and a terminal G1 respectively. The anode and cathode of a diode D11 are connected to the terminal E1/E2 and the terminal C1 respectively. That is to say, the transistor Q11 and the diode D11 are connected in inverse parallel.

The emitter, collector, auxiliary emitter, and gate of the transistor Q12 are connected to a terminal E1/E2, a terminal C2, a terminal E2s, and a terminal G2 respectively. The anode and cathode of a diode D12 are connected to the terminal E1/E2 and the terminal C2 respectively. That is to say, the transistor Q12 and the diode D12 are connected in inverse parallel.

The terminals E1/E2 are electrically connected inside the intermediate arm block 5a. That is to say, all of the emitter of the transistor Q11, the emitter of the transistor Q12, the anode of the diode D11, and the anode of the diode D12 are connected to the terminals E1/E2. The transistors Q11 and Q12 are connected in this way in anti-series.

The terminal C1 of the intermediate arm block 5a is connected to an intermediate potential point M which is a connection point common to capacitors Ca and Cb, and the terminal C2 of the intermediate arm block 5a is connected to an intermediate connection point U which is a connection point common to transistors Q1 and Q2.

By adopting the above structure, the intermediate arm block 5a passes current in both directions by putting one of the transistors Q11 and Q12 into an on state and putting the other into an off state. That is to say, the intermediate arm block 5a has the function of a bidirectional switch. This is the same with the first embodiment.

With a semiconductor device (not illustrated) of the intermediate arm block 5a terminals to which external terminals 23, 24, and 25 are connected are different from the terminals to which the external terminals 23, 24, and 25 are connected in the first embodiment. That is to say, the external terminals 23 are connected to the terminals E1/E2 common to the emitters of the transistors Q11 and Q12, the external terminals 24 are connected to the terminal C1 of the collector of the transistor Q11, and the external terminals 25 are connected to the terminal C2 of the collector of the transistor Q12.

The collector electrode of a first switching element 14 corresponding to the transistor Q11 is connected via a first circuit board 12a and a conductive post 19 to metal layers 18b and 18h first and is then connected via a conductive post 19 and a third circuit board 12i (or a third circuit board 12j) to the external terminal 24 (terminal C1). The emitter electrode of the first switching element 14 is connected via a conductive post 20 to metal layers 18a and 18g first and is then connected via a conductive post 19 and a third circuit board 12g (or a third circuit board 12h) to the external terminal 23 (terminal E1/E2). The gate electrode of the first switching element 14 is connected via a conductive post 20 to a metal layer 18d first and is then connected via a conductive post 19 and a third circuit board 12c to an external terminal 21a (terminal G1). The auxiliary emitter electrode of the first switching element 14 is connected via a conductive post 20 to the metal layer 18g first and is then connected via the metal layer 18g, a metal layer 18k, a conductive post 19, and a third circuit board 12e to an external terminal 22a (terminal E1s).

The cathode electrode of a first diode 15 corresponding to the diode D11 is connected via the first circuit board 12a and the conductive post 19 to the metal layers 18b and 18h first and is then connected via the conductive post 19 and the third circuit board 12i (or the third circuit board 12j) to the external terminal 24 (terminal C1). The anode electrode of the first diode 15 is connected via the conductive post 20 to the metal layers 18a and 18g first and is then connected via the conductive post 19 and the third circuit board 12g (or the third circuit board 12h) to the external terminal 23 (terminal E1/E2).

The collector electrode of a second switching element 16 corresponding to the transistor Q12 is connected via a second circuit board 12b to the external terminal 25 (terminal C2). The emitter electrode of the second switching element 16 is connected via a conductive post 20 to a metal layer 18i first and is then connected via the metal layer 18g, the conductive post 19, and the third circuit board 12g (or the third circuit board 12h) to the external terminal 23 (terminal E1/E2). The gate electrode of the second switching element 16 is connected via a conductive post 20 to a metal layer 18e first and is then connected via a conductive post 19 and a third circuit board 12d to an external terminal 21b (terminal G2). The auxiliary emitter electrode of the second switching element 16 is connected via a conductive post 20 to the metal layer 18i first and is then connected via a metal layer 18l, a conductive post 19, and a third circuit board 12f to an external terminal 22b (terminal E2s).

The cathode electrode of a second diode 17 corresponding to the diode D12 is connected via the second circuit board 12b to the external terminal 25 (terminal C2). The anode electrode of the second diode 17 is connected via a conductive post 20 to the metal layer 18i first and is then connected via the metal layer 18g, the conductive post 19, and the third circuit board 12g (or the third circuit board 12h) to the external terminal 23 (terminal E1/E2).

Wiring inside the semiconductor device having the above structure is formed of a printed circuit board 18 and the conductive posts 19 and 20. This is the same with the first embodiment. As a result, current paths are broad and short compared with the bonding wires used in the conventional semiconductor device 100. Therefore, the wiring inductance is significantly reduced. This means that a semiconductor device which accommodates high-speed switching is realized.

Third Embodiment

Figure 9:
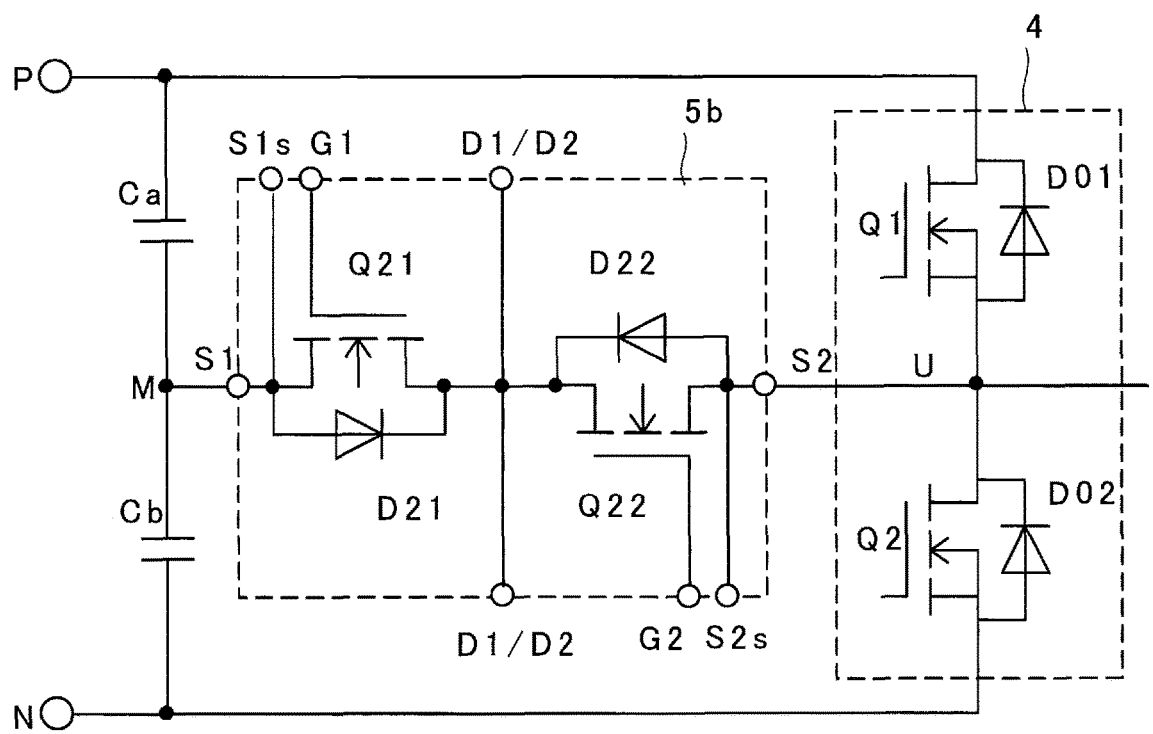
FIG. 9 is a circuit diagram which illustrates an example of the structure of a three-level inverter unit to which a semiconductor device according to a third embodiment is applied.

FIG. 9 is a circuit diagram which illustrates an example of the structure of a three-level inverter unit to which a semiconductor device according to a third embodiment is applied.

IGBTs are used as the transistors in the intermediate arm block 5 according to the first embodiment. However, power MOSFETs are used as transistors in an intermediate arm block 5b which is a semiconductor device according to a third embodiment. That is to say, the intermediate arm block 5b includes transistors Q21 and Q22, which are power MOSFETs, and diodes D21 and D22. Accordingly, components which are the same as or equivalent to those illustrated in the first embodiment will be marked with the same numerals in the following description and detailed descriptions of them will be omitted.

The source, drain, auxiliary source, and gate of the transistor Q21 are connected to a terminal S1, a terminal D1/D2, a terminal S1s, and a terminal G1 respectively. The anode and cathode of the diode D21 are connected to the terminal S1 and the terminal D1/D2 respectively. That is to say, the transistor Q21 and the diode D21 are connected in inverse parallel.

The source, drain, auxiliary source, and gate of the transistor Q22 are connected to a terminal S2, a terminal D1/D2, a terminal S2s, and a terminal G2 respectively. The anode and cathode of the diode D22 are connected to the terminal S2 and the terminal D1/D2 respectively. That is to say, the transistor Q22 and the diode D22 are connected in inverse parallel.

The terminals D1/D2 are electrically connected inside the intermediate arm block 5b. That is to say, all of the drain of the transistor Q21, the drain of the transistor Q22, the cathode of the diode D21, and the cathode of the diode D22 are connected to the terminals D1/D2. The transistors Q21 and Q22 are connected in this way in anti-series.

The terminal S1 of the intermediate arm block 5b is connected to an intermediate potential point M which is a connection point common to capacitors Ca and Cb, and the terminal S2 of the intermediate arm block 5b is connected to an intermediate connection point U which is a connection point common to transistors Q1 and Q2.

As a result, the intermediate arm block 5b functions as a bidirectional switch by putting one of the transistors Q21 and Q22 into an on state and putting the other into an off state.

The intermediate arm block 5b has the same structure as the intermediate arm block 5 according to the first embodiment has. Accordingly, the same first circuit board 12a, second circuit board 12b, and printed circuit board 18 that are illustrated in the first embodiment may be used.

Fourth Embodiment

Figure 10:
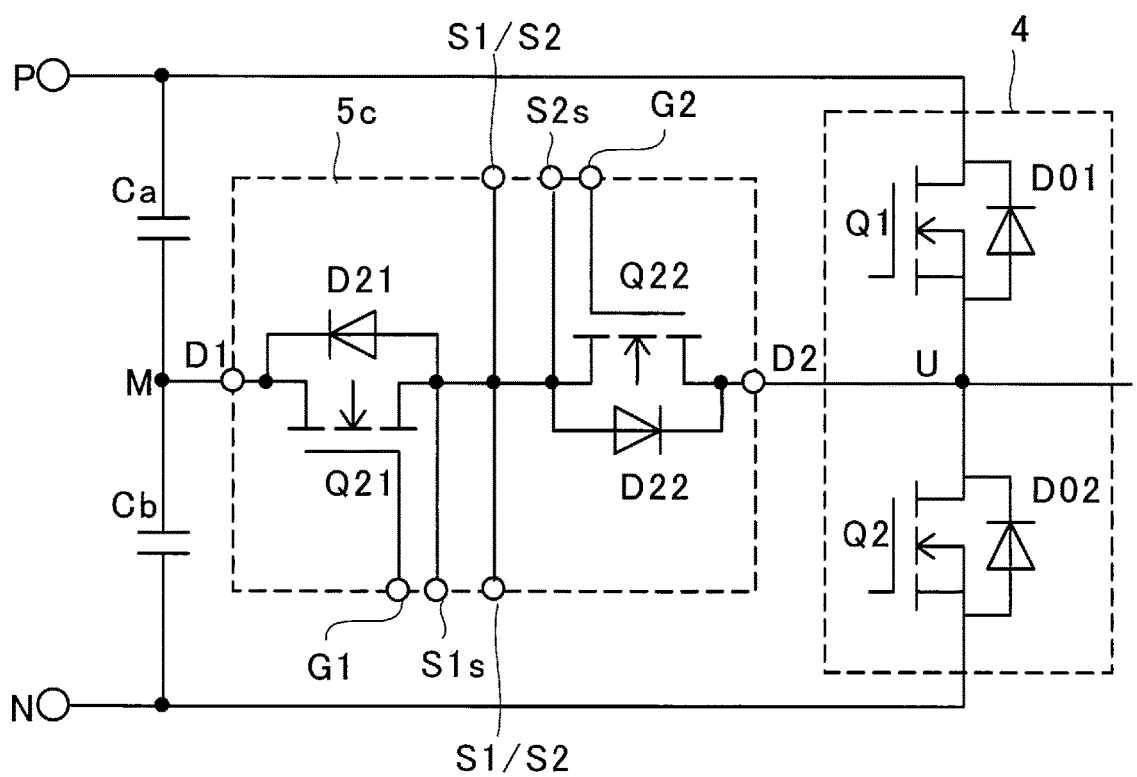
FIG. 10 is a circuit diagram which illustrates an example of the structure of a three-level inverter unit to which a semiconductor device according to a fourth embodiment is applied.
Figure 11:
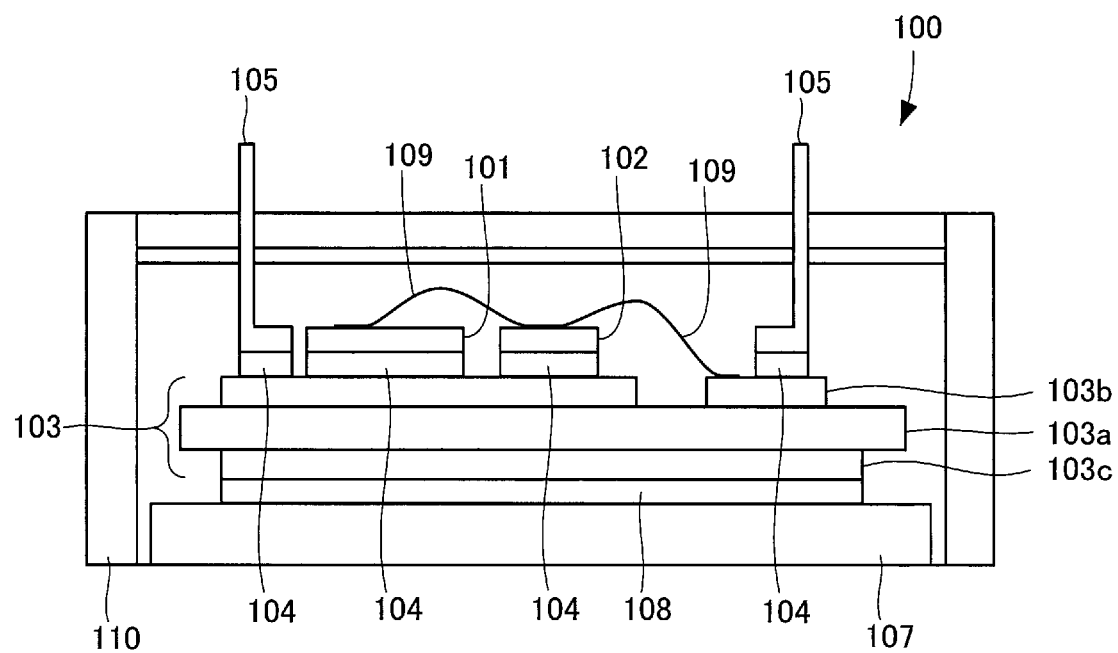
FIG. 11 is a sectional view which illustrates an example of the structure of a conventional semiconductor device.

FIG. 10 is a circuit diagram which illustrates an example of the structure of a three-level inverter unit to which a semiconductor device according to a fourth embodiment is applied.

IGBTs are used as the transistors in the intermediate arm block 5a according to the second embodiment. However, power MOSFETs are used as transistors in an intermediate arm block 5c which is a semiconductor device according to a fourth embodiment. That is to say, the intermediate arm block 5c includes transistors Q21 and Q22, which are power MOSFETs, and diodes D21 and D22. Accordingly, components which are the same as or equivalent to those illustrated in the second embodiment will be marked with the same numerals in the following description and detailed descriptions of them will be omitted.

The source, drain, auxiliary source, and gate of the transistor Q21 are connected to a terminal S1/S2, a terminal D1, a terminal S1s, and a terminal G1 respectively. The anode and cathode of the diode D21 are connected to the terminal S1/S2 and the terminal D1 respectively. That is to say, the transistor Q21 and the diode D21 are connected in inverse parallel.

The source, drain, auxiliary source, and gate of the transistor Q22 are connected to a terminal S1/S2, a terminal D2, a terminal S2s, and a terminal G2 respectively. The anode and cathode of the diode D22 are connected to the terminal S1/S2 and the terminal D2 respectively. That is to say, the transistor Q22 and the diode D22 are connected in inverse parallel.

The terminals S1/S2 are electrically connected inside the intermediate arm block 5c. That is to say, all of the source of the transistor Q21, the source of the transistor Q22, the anode of the diode D21, and the anode of the diode D22 are connected to the terminals S1/S2. The transistors Q21 and Q22 are connected in this way in anti-series.

The terminal D1 of the intermediate arm block 5c is connected to an intermediate potential point M which is a connection point common to capacitors Ca and Cb, and the terminal D2 of the intermediate arm block 5c is connected to an intermediate connection point U which is a connection point common to transistors Q1 and Q2.

As a result, the intermediate arm block 5c functions as a bidirectional switch by putting one of the transistors Q21 and Q22 into an on state and putting the other into an off state.

The intermediate arm block 5c has the same structure as the intermediate arm block 5a according to the second embodiment has. Accordingly, the same first circuit board 12a, second circuit board 12b, and printed circuit board 18 that are illustrated in the first embodiment may be used.

In the present specification and claims, the term "conductive post" refers to a column of conductive material that is formed to be free-standing. As described above, after manufacture or after positioning of the post within the electrical circuit, the post and other components may be covered by resin. However, in embodiments of the invention, the post is not formed by filling an opening in the resin with conductive material.

With the semiconductor device having the above structure, the wiring inductance in the semiconductor device is reduced and the external wiring inductance between the semiconductor device and another semiconductor device is reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device comprising:
a first insulating substrate having a first circuit board on an upper surface thereof and having a first metal board on an under surface thereof, the first circuit board having a first switching element and a first diode mounted thereon;
a second insulating substrate having a second circuit board on an upper surface thereof and having a second metal board on an under surface thereof, the second circuit board having a second switching element and a second diode mounted thereon;
a printed circuit board including a metal layer and being disposed opposite to the first insulating substrate and the second insulating substrate;
at least one first conductive post connecting the metal layer of the printed circuit board with the first circuit board; and
at least one second conductive post connecting the metal layer of the printed circuit board with the second circuit board,
wherein the first insulating substrate and the second insulating substrate are disposed side by side in a horizontal direction,
the at least one first conductive post is connected to the first circuit board at a location spaced apart from the first switching element and the first diode,
the first switching element and the second switching element are configured to form a bidirectional switch,
the first switching element is connected to the first diode in inverse parallel,
the second switching element is connected to the second diode in inverse parallel, and
the first switching element is connected to the second switching element in anti-series via the first circuit board, the at least one first conductive post, the metal layer, the at least one second conductive post and the second circuit board.

2. The semiconductor device according to claim 1, wherein:
the at least one first conductive post is disposed on a first peripheral region of the first circuit board, and is spaced apart from the first switching element and the first diode, and the at least one second conductive post is disposed on a second peripheral region of the second circuit board adjacent to the first peripheral region of the first circuit board, and is spaced apart from the second switching element and the second diode.

3. The semiconductor device according to claim 1, wherein
the at least one first conductive post is in directly connected with the first circuit board, and
the at least one second conductive post is in directly connected with the second circuit board.

4. The semiconductor device according to claim 1, further comprising:
at least one third conductive post connecting the metal layer of the printed circuit board with a first surface of the first switching element; and
at least one fourth conductive post connecting the metal layer of the printed circuit board with a first surface of the first diode, wherein
the first switching element includes a second surface opposite to the first surface, and the second surface of the first switching element faces the first circuit board, and
the first diode includes a second surface opposite to the first surface, and the second surface of the first diode faces the first circuit board.

5. The semiconductor device according to claim 1, wherein the at least one first conductive post is connected to the first circuit board at a location closer to an edge of the first circuit board than are a location of the first switching element and a location of the first diode.

6. The semiconductor device according to claim 1, further comprising:
at least one third conductive post connecting the metal layer of the printed circuit board with the first circuit board, the at least one third conductive post connected to the first circuit board at a location spaced apart from the first switching element and the first diode, wherein
the first diode is closer to a first edge of the first circuit board than is a second edge opposite to the first edge,
the first switching element is closer to the second edge than is the first edge,
the at least one first conductive post is located closer to the first edge than is the first diode, and
the at least one third conductive post is located closer to the second edge than is the first switching element.

7. The semiconductor device according to claim 1, wherein
the first switching element, the first diode, the second switching element, and the second diode are aligned with an alignment line,
the first insulating substrate has a plurality of third circuit boards on its upper surface, the third circuit boards being disposed symmetrically with respect to the alignment line, and
the second insulating substrate has a plurality of fourth circuit boards on its upper surface, the fourth circuit boards being disposed symmetrically with respect to the alignment line.

* * * * *